US009222196B2

(12) United States Patent
Kimbel et al.

(10) Patent No.: US 9,222,196 B2
(45) Date of Patent: Dec. 29, 2015

(54) DIRECTIONAL SOLIDIFICATION FURNACE FOR REDUCING MELT CONTAMINATION AND REDUCING WAFER CONTAMINATION

(75) Inventors: Steven L. Kimbel, St. Charles, MO (US); Jihong (John) Chen, St. Charles, MO (US); Richard G. Schrenker, Chesterfield, MO (US); Lee W. Ferry, St. Charles, MO (US)

(73) Assignee: MEMC Singapore Pte. Ltd. (UEN200614794D), Singapore (SG)

( * ) Notice: Subject to any disclaimer, the term of this patent is extended or adjusted under 35 U.S.C. 154(b) by 976 days.

(21) Appl. No.: 13/354,014

(22) Filed: Jan. 19, 2012

(65) Prior Publication Data

US 2012/0186299 A1    Jul. 26, 2012

Related U.S. Application Data

(62) Division of application No. 12/563,124, filed on Sep. 19, 2009, now Pat. No. 8,317,920.

(60) Provisional application No. 61/098,570, filed on Sep. 19, 2008.

(51) Int. Cl.
*C30B 11/02* (2006.01)
*C30B 11/00* (2006.01)
*C30B 28/06* (2006.01)
*C30B 29/06* (2006.01)

(52) U.S. Cl.
CPC .............. *C30B 11/002* (2013.01); *C30B 11/02* (2013.01); *C30B 28/06* (2013.01); *C30B 29/06* (2013.01); *Y10T 117/1092* (2015.01)

(58) Field of Classification Search
CPC ....................................................... C30B 11/02
USPC ............................................... 117/81, 82, 83
See application file for complete search history.

(56) References Cited

U.S. PATENT DOCUMENTS

| 6,153,011 | A | 11/2000 | Pandelisev |
| 6,299,682 | B1 | 10/2001 | Wakita et al. |
| 2002/0139297 | A1 | 10/2002 | Wakita et al. |
| 2004/0050522 | A1 | 3/2004 | Wakita et al. |
| 2009/0090296 | A1 | 4/2009 | Gil et al. |

FOREIGN PATENT DOCUMENTS

| CN | 101194051 A | 6/2008 |
| DE | 102006017622 A1 | 10/2007 |
| EP | 1048758 A1 | 11/2000 |
| EP | 1384538 A1 | 1/2004 |

(Continued)

OTHER PUBLICATIONS

Written Communication; First Office Action issued in related Japanese Patent Application No. 2011-528024, issued Jan. 7, 2014; 2 pgs.
Written Communication; First Office Action issued in related Chinese Patent Application No. 200980136897.8 dated Oct. 10, 2012; 9 pgs.

(Continued)

*Primary Examiner* — Robert M Kunemund
(74) *Attorney, Agent, or Firm* — Armstrong Teasdale LLP

(57) ABSTRACT

A directional solidification furnace includes a crucible for holding molten silicon and a lid covering the crucible and forming an enclosure over the molten silicon. The crucible also includes an inlet in the lid for introducing inert gas above the molten silicon to inhibit contamination of the molten silicon.

18 Claims, 11 Drawing Sheets

(56) References Cited

FOREIGN PATENT DOCUMENTS

| | | |
|---|---|---|
| JP | 2001010810 A | 1/2001 |
| JP | 2003137525 A | 5/2003 |
| JP | 2003165716 A | 6/2003 |
| JP | 2006306699 A | 11/2006 |
| JP | 2007008789 A | 1/2007 |
| JP | 2009541195 A | 11/2009 |
| WO | 2006126371 A1 | 11/2006 |
| WO | 2007148985 A1 | 12/2007 |

OTHER PUBLICATIONS

Written Communication issued in related European Patent Application No. 09 792 746.1-1215 dated Sep. 5, 2012; pp. 4.

Written Opinion issued in related Singapore Patent Application No. 201101653-2 dated Mar. 30, 2012; 7 pages.

Written Communication issued in related European Patent Application No. 09 792 746.1-1215 dated Apr. 23, 2012; 4 pages.

PCT International Search Report and Written Opinion of the International Search Authority mailed on Dec. 12, 2009 regarding PCT US/2009/057602, 10 pages.

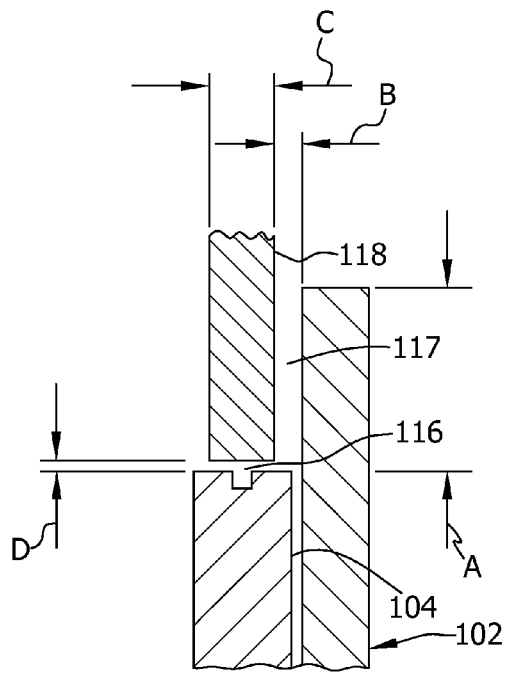
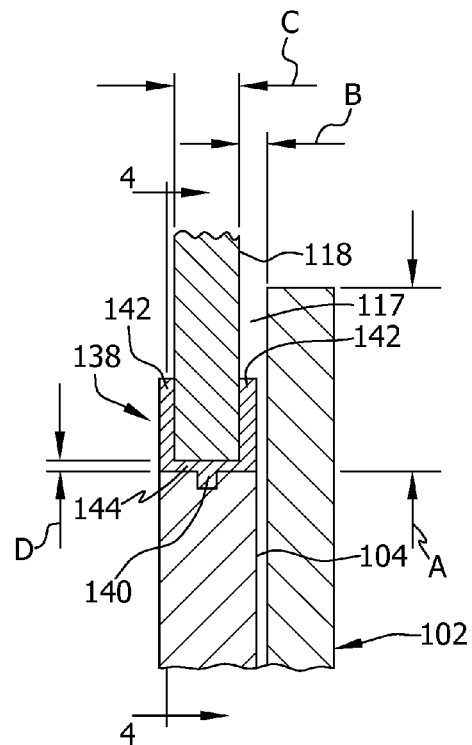
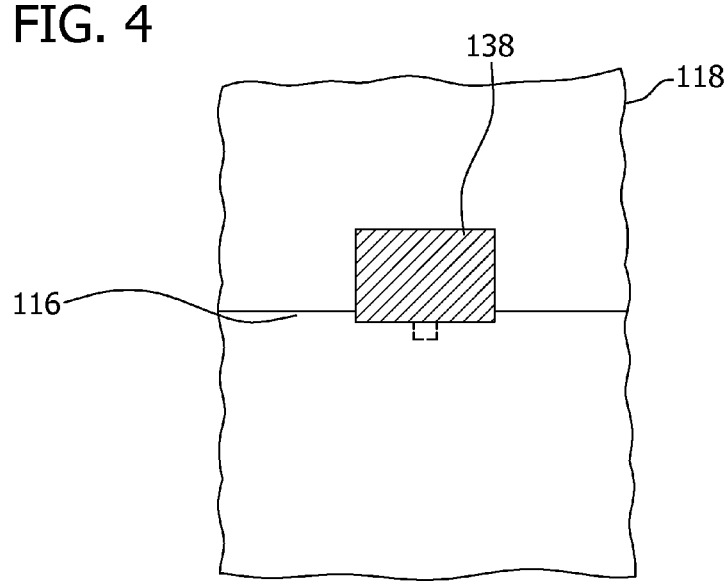

DIRECTIONAL SOLIDIFICATION FURNACE FOR REDUCING MELT CONTAMINATION AND REDUCING WAFER CONTAMINATION

CROSS-REFERENCE TO RELATED APPLICATIONS

This application is a divisional of U.S. patent application Ser. No. 12/563,124 filed on Sep. 19, 2009, which claims priority to provisional application No. 61/098,570 filed on Sep. 19, 2008. The entire disclosures of both applications are incorporated herein by reference.

BACKGROUND

This invention generally relates to directional solidification furnaces and, more specifically, to an apparatus and method for directing an inert gas flow into the furnace.

Directional solidification furnaces are often used in the production of multi-crystalline silicon ingots. Raw silicon is first loaded into a quartz crucible. The silicon can take the form of solid chunks, recycled polysilicon, silicon dust, or a combination of them. The crucible is typically constructed of quartz, or another suitable material that can withstand high temperatures while remaining essentially inert. The crucible is typically a five-sided box, with the top of the box being open to the atmosphere within the furnace. The quartz crucible is supported by graphite support walls that add structural rigidity to the crucible.

After the crucible has been charged with silicon, the area surrounding the crucible is sealed from the outside ambient environment. To aid in the separation of the crucible from the outside environment, the crucible is placed within a containment vessel that forms part of the furnace. The pressure within the containment vessel is then reduced. The content of the atmosphere within the containment vessel can also be monitored and controlled.

The crucible and the charge are then heated to a temperature sufficient to melt the silicon. After the charge has completely melted it is cooled at a controlled rate to achieve a directional solidification structure. The controlled rate of cooling is established by any combination of reducing the amount and location of heat applied by the radiant heaters, the movement of or the opening of a heat vent in insulation surrounding the crucible, or the circulation of a cooling medium through a cooling plate. Any of these methods transfer heat away from the surface of the crucible. If the rate of cooling of the bottom of the crucible is greater than that of the sides of the crucible, then a relatively flat, horizontal solidification isotherm with predominately axial thermal gradients is generated. The ingot thereby solidifies in the region closest to the cooler side of the crucible and proceeds in a direction away from that side of the crucible. The last portion of the melt to solidify is generally at the top of the ingot.

A significant concern in the production of multi-crystalline silicon ingots in directional solidification furnaces is the contamination of the ingot with impurities. An entry point of contamination is often at the melt surface. Gaseous or solid carbon or other contaminants present in the containment vessel enter at the melt surface and are at least partially absorbed by the melt, and are subsequently incorporated into the ingot upon solidification sometimes as a precipitated compound. Some of the sources of carbon contamination are carbon monoxide gas formed when the crucible and walls are heated, as well as oxygen-containing compounds contacting heated insulation as graphite or the deterioration of friable insulation surrounding the walls and the interior of the furnace enclosure resulting in particulate carbon contamination. The carbon monoxide gas is formed in the following reaction: $SiO(g)+C(s)=>SiC(s)+CO(g)$ and $O2(g)+2*C(s)=>2*CO(g)$ where the source of the gaseous SiO can be evaporation from the free silicon melt surface or decomposition of the crucible by the reaction $2*SiO2(g)=>2*SiO(g)+O2(g)$, and the oxygen may originate from air remaining in the furnace or air leaks into the furnace. Decomposition of the quartz crucible by the adjacent crucible support is also an important source of carbon containing species. This occurs by a reaction such as $SiO2+2*C(s)=>SiC(s)+CO(g)$ The carbon monoxide or carbon dioxide gas (created from any source) reacts with the melt surface as represented by the following reactions: $Si(1)+CO(g)\sim SiO(g)+C$ or $Si(1)+CO2(g)=>2*SiO(g)+C$.

Carbon precipitates in silicon ingots cause undesirable electrical shunts in the products that are eventually fabricated from the ingots, such as solar cells. Carbon also contaminates the recycle stream of silicon, as unused or unsatisfactory ingots are often recycled to form new ingots. Consequently, reducing the carbon contamination of the melt decreases the carbon contamination levels of the recycle stream.

Attempts have been made to introduce an inert gas flow in the furnace, but they have not been completely satisfactory due to an ineffective flow path. Accordingly, an efficient and effective apparatus and method are needed to introduce an inert gas flow to reduce contamination levels in the ingot.

BRIEF SUMMARY

In one aspect, a directional solidification furnace comprises a crucible for holding molten silicon and a lid covering the crucible and forming an enclosure over the molten silicon. The crucible also comprises an inlet in the lid for introducing inert gas above the molten silicon to inhibit contamination of the molten silicon.

In another aspect, a directional solidification furnace comprises a crucible for holding molten silicon and a crucible support for supporting the crucible. The furnace also comprises a lid covering the crucible and crucible support and forming an enclosure over the molten silicon. The furnace further comprises an inlet in the lid for introducing inert gas above the molten silicon. A first gap and a second gap are disposed adjacent the lid. The first and second gaps define a nonlinear flow path for facilitating removal of contaminants from the enclosure and allowing the inert gas to exit the enclosure.

In still another aspect, a method of manufacturing a multi-crystalline ingot comprises placing solid polysilicon into a crucible and placing a lid over the crucible to form an enclosure having a labyrinth gap between the lid and the crucible. The method further comprises applying heat to melt the polysilicon. The method also comprises introducing inert gas to the enclosure such that the gas purges contaminants from the enclosure and exits the enclosure only through the gap. The method also comprises solidifying the molten polysilicon to form the ingot.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

FIG. 3A is a cross-section of a portion of the crucible support and a portion of the lid;

FIG. 3B is a cross-section of a portion of the crucible support and a portion of the lid positioned on a support bracket;

FIG. 4 is a cross-section along line 4-4 in FIG. 3B;

DETAILED DESCRIPTION

Figure 1:
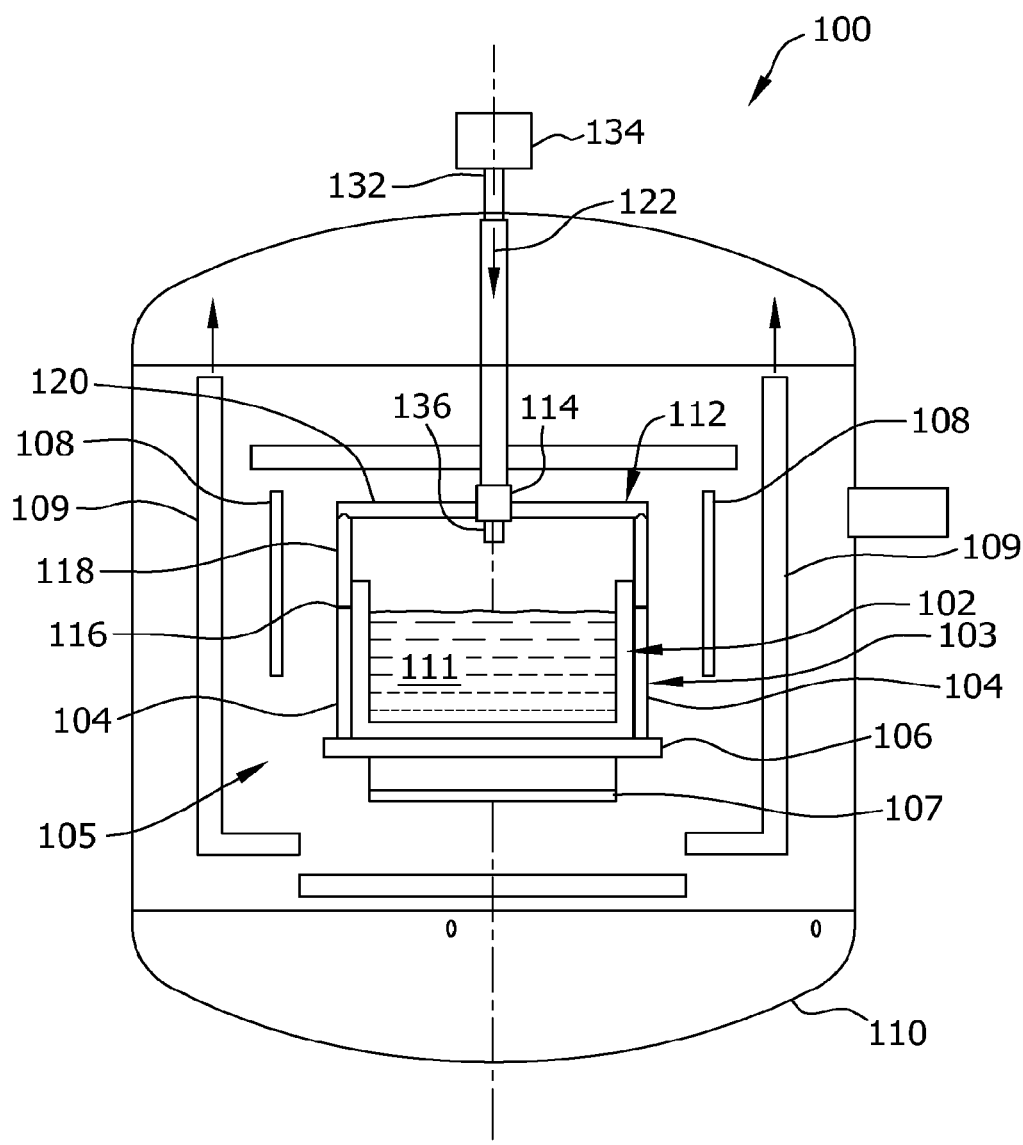
FIG. 1 is a partially schematic cross-section of a directional solidification furnace in accordance with one embodiment.
Figure 2:
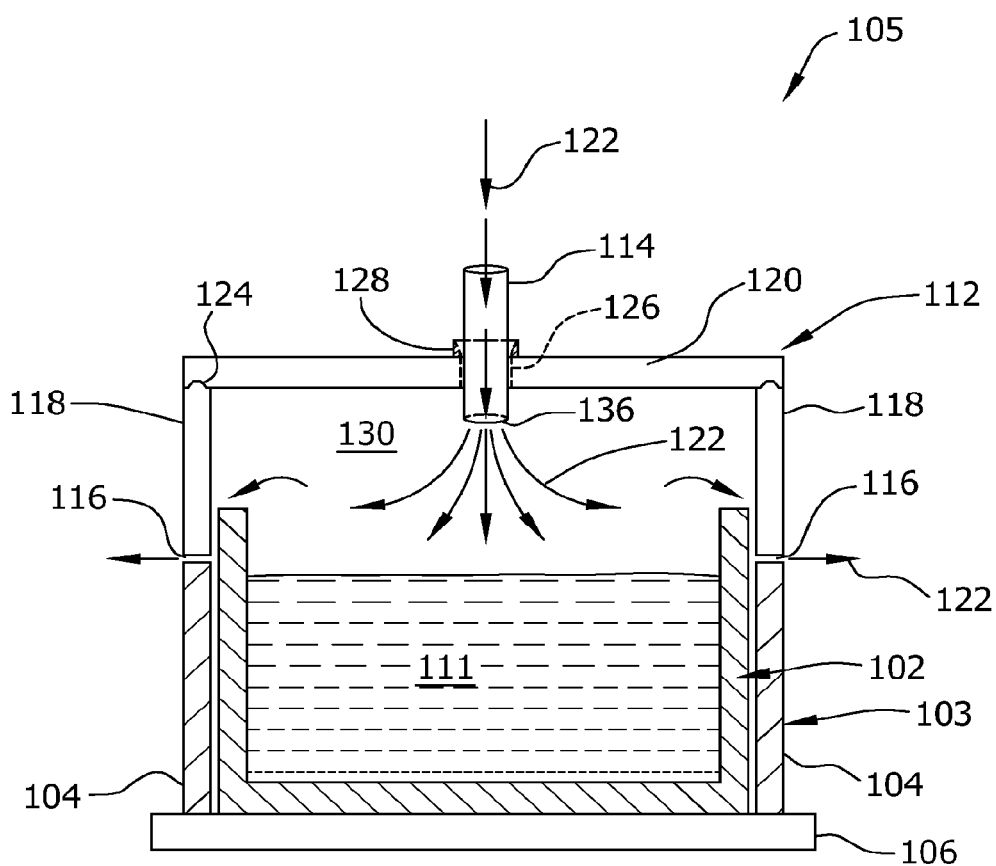
FIG. 2 is a cross-section of a lid, crucible, and crucible support of FIG. 1, and schematically illustrates the flow of inert gas through the enclosed space above the silicon melt.

Referring to FIG. 1, a directional solidification furnace of this embodiment is generally referred to as 100. The directional solidification furnace comprises a quartz crucible 102 supported by a crucible support 103 including walls 104 (crucible support walls) and a crucible base 106. It is contemplated to use other structure or means to support the crucible. Together with a lid 112 described below, the crucible 102, walls 104 and crucible base 106 form a crucible assembly or an inner assembly 105 (FIG. 2). This inner assembly 105 may also include a heat exchanger 107 disposed beneath the crucible base 106. In one embodiment, the inner assembly 105 has no leaks other than vents or gaps purposefully formed therein. Likewise, the furnace 100 may have no or substantially no leaks therein.

In this embodiment, heaters 108 are positioned around the walls 104 and within a containment vessel 110. The heaters 108 may suitably be radiant heaters. The heaters 108 apply the heat necessary to melt charge material within the crucible. The charge material of this embodiment is silicon, though other materials are contemplated. Side insulation 109 is disposed around the crucible and may be partially opened, such as by vertical movement (shown by arrows in FIG. 1). Once the silicon charge has melted, a cooling medium may be introduced to the heat exchanger 107 or the insulation 109 may be raised to aid in the directional solidification of the silicon. The heat output of the heaters 108 may be adjusted so that less heat is applied to the melt 111. The position of the heaters 108 may also be adjusted relative to the crucible by moving them away from the crucible 102, especially away from the crucible base 106. Additionally, insulation surrounding the furnace may be moved relative to the furnace to permit more heat to be transferred away from the furnace. Directional solidification of the ingot is then achieved through any combination of these processes. Accordingly, the portion of the melt 111 nearest the crucible base 106 solidifies first and the solidification proceeds in a general upward fashion away from the crucible support base 106. The last portion to solidify is the top surface of the melt 111.

A lid 112 of this embodiment is positioned atop the crucible 102 to contain and direct a flow of inert gas. As shown in FIG. 2, the flow of inert gas is introduced to the lid 112 through an inlet tube 114 and after flowing along the top surface of the melt 111 exits through gaps (described infra in relation to FIGS. 3A and 3B) beneath the top of the crucible 102 and between the walls 104 and the vertical plates 118. As further described below and as shown in FIG. 2, the gap may define a labyrinth or tortuous path through which the exhaust flows. This path for the exhaust reduces carbon-containing gas levels near the top surface of the melt 111.

FIG. 2 is a cross-section of the lid 112 and the surrounding structures. The lid 112 includes four vertical plates 118 and a horizontal plate 120. Each of the vertical plates 118 and horizontal plate 120 has an inner and an outer surface. The four vertical plates 118 and the horizontal plate 120 may be joined together by any suitable connection or connections, including without limitation, fasteners, pins, tongue and groove, or shiplap joints. The inner surfaces of the vertical plates 118 face the interior of the area enclosed by the lid 112, while the outer surfaces face the exterior of the lid. The length and width of the lid 112 is substantially similar to, but slightly greater than, that of the crucible 102.

In one embodiment, the top side of the vertical plates 118 fit into recesses 124 formed in the inner surface of the horizontal plate 120. The weight of the horizontal plate 120 then serves to hold the lid 112 together, while still providing for easy assembly and disassembly of the lid. In some embodiments, a plurality of pins can be used to further secure the vertical plates 118 to the horizontal plate 120. The pins are inserted through holes in the vertical plates 118 and corresponding holes in the horizontal plate 120. The joints between the vertical plates 118 and the horizontal plates 120 inhibit the flow of inert gas through the joints. In this embodiment, any flow of inert gas through the joint is minimal and does not affect the overall flow of inert gas in the enclosed area.

The horizontal plate 120 may be a single piece of material or may be comprised of several pieces, or interlocking pieces, e.g., for ease of manufacturing and handling. The vertical plates 118 and horizontal plate 120 may also be of a monolithic, singlepiece design and the lid 112 is thus formed from a single piece of material. The horizontal plate 120 has a hole 126 formed therein for receiving the inlet tube 114. Some embodiments include an additional sealing ring 128 disposed above the hole 126 for tube alignment and/or sealing. The ring 128 and the inlet tube 114 may be made of the same or similar material as one another and as the vertical plates 118 and 120 of the lid 112. The sealing ring 128 has an inner surface that contacts the inlet tube 114. The inner diameter of the ring 128 is substantially similar to the outer diameter of the inlet tube 114. In some embodiments the inner surface of the ring 128 is tapered along its longitudinal axis for alignment. The diameter of the inner surface decreases towards the surface of the ring 128 that rests upon the horizontal plate 120.

The inlet tube 114 is used to introduce inert gas through the horizontal plate 120 of the lid 112 into the enclosed area 130. The inlet tube 114 has a generally circular cross-section, although other embodiments may include differently shaped cross-sections. The inlet tube 114 is constructed of materials similar to those used in the construction of the other pieces of the lid 112.

A first end 132 of the inlet tube 114 is connected to an inert gas source 134, as depicted in FIG. 1. In some embodiments, the inert gas is Argon. As shown in FIG. 2, a second end 136 of the inlet tube 114 penetrates the horizontal plate 120 of the lid 112 through the opening described above. The second end 136 of the inlet tube 114 can fit flush with the inner surface of the horizontal plate 120 or it may extend below it and into the enclosed area 130. The depth of the penetration of the second end 136 of the inlet tube 114 into the enclosed area 130 can be adjusted to alter the characteristics of the inert gas flow in the enclosed area 130. This adjustment does not alter the purity of the gas in the enclosed area.

In this embodiment, the hole 126 in the horizontal plate 120 and the inlet tube 114 are positioned in the center of the horizontal plate 120. But in other embodiments, the hole 126 and the inlet tube 114 may be positioned off-center. The position of the hole 126 and inlet tube 114 may also be adjusted to alter the flow of inert gas within the enclosed area 130. Additionally, some embodiments include multiple holes and corresponding inlet tubes in order to alter the characteristics and distribution of the inert gas flow within the enclosed area 130. Furthermore, differing size holes and corresponding inlet tubes may be used, as well as varying flow rates to manipulate the inert gas flow, according to some embodiments.

Figure 12:
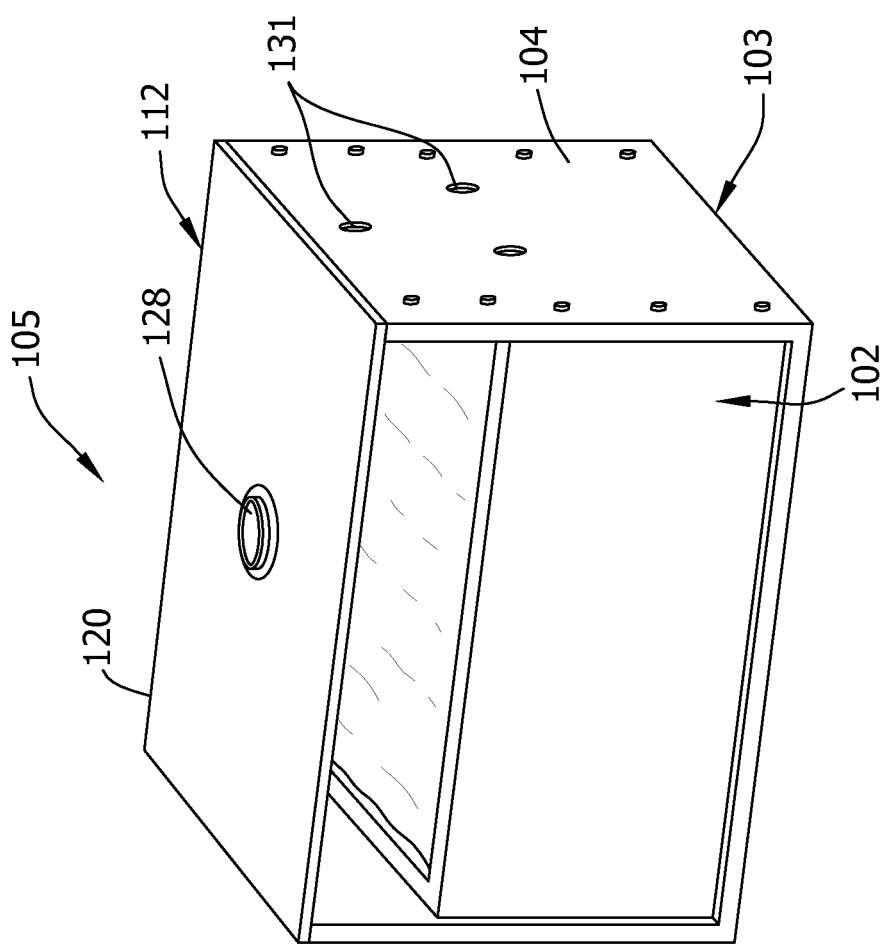
FIG. 12 is a schematic perspective view of an assembled crucible support and lid with one of the walls and a portion of the lid removed.

In other embodiments the four vertical plates 118 are not used (see FIG. 12). In these embodiments, the horizontal plate 120 rests directly on the crucible support walls 104 and a gap is formed beneath the top of the crucible 102 in the walls 104. For example, the gap may be formed by drilling, slotting or otherwise forming openings in the walls 104.

Returning now to the embodiment of FIGS. 1-4, the vertical plates 118 and horizontal plate 120 are constructed of a material that maintains its structural integrity and is minimally reactive under elevated temperatures for a prolonged period of time. Suitable materials include a form of carbon, such as graphite, and can be similar in composition to the walls 104. In some embodiments, the vertical plates 118 and 120 are constructed of high purity silicon carbide coated graphite.

The crucible 102, inlet tube 114, and other related components are not expected to contribute significant amounts of carbon to the melt 111. However, graphite components can become brittle and be fractured by the surface chemical conversion to SiC due to the high temperature reaction with SiO or the splattering of liquid silicon thereon. The graphite components may be coated to prevent contributing carbon to the melt since fractured graphite surfaces can release carbon particles.

FIG. 3A is a cross-sectional view of one of the vertical plates 118 of the lid 112 and FIG. 3B is a cross-sectional view of one of the vertical plates 118 of the lid 112 resting upon a support bracket 138. As described above, the crucible 102 is surrounded by corresponding walls 104. A first gap 116 and a second gap 117 are shown in FIGS. 3A and 3B. The second gap 117 is defined between the crucible 102 and the vertical plates 118. The second gap 117 has a width B. A portion of the crucible 102 extends vertically upward beyond the walls 104 by a height A. In one embodiment, the height A is 38 mm and the width B is 9.5 mm, resulting in a ratio of A to B of about 4:1, In other embodiments, the ratio of A to B may be between about 2:1 and about 11:1 (or between about 2 and about 11), while in other embodiments the ratio may be between about 3:1 and about 10:1 (or between about 3 and about 10), while in still other embodiments the ratio may be greater than or equal to about 4:1 (or about 4).

The first gap 116 is defined between the walls 104 and the vertical plate 118. The first gap 116 has a width C equal to the width of the vertical plate 118 and a height D equal to the distance between the edges of the vertical plate and the wall 104. In one embodiment, the width C is 9.5 mm and the height D is 1.6 mm, resulting in a ratio of C to D of 5.94 (or about 6). In other embodiments, the ratio of C to D may be between about 4:1 and about 13:1 (or between about 4 and about 13), while in other embodiments the ratio may be between about 5:1 and about 12:1 (or between about 5 and about 12), while in still other embodiments the ratio may be greater than or equal to about 6:1 (or about 6).

In some embodiments, the width C and height D of first gap 116 are selected to achieve the same vertical cross-sectional area as the argon inlet area (FIG. 2, oriented horizontally as shown). In other embodiments, the gap is selected or adjusted based on ingot carbon levels. In the illustrated embodiments, the walls 104 terminate below the crucible 102, leaving a portion of the crucible exposed when the lid 112 is not in place. In other embodiments, the walls 104 do not terminate below the crucible 102 and thus no portion of the crucible is exposed when the lid is not in place.

In another embodiment, first gap 116 is less than about 5 millimeters, and is defined between the walls 104 and the crucible 102. In this embodiment, the first gap 116 is selected to achieve the same vertical cross-sectional area as the argon inlet area, i.e., the inlet tube 114. The ratio of the gap cross-sectional area to the inlet cross-sectional area may be about 0.5 to about 10, or in another embodiment about 0.8 to about 1.2, or in other embodiments about 1. In this embodiment, the gap is selected or adjusted based on ingot carbon levels (e.g., ingot carbon measurement feedback) and/or to achieve sufficient exhaust flow speed to inhibit backflow.

A plurality of support brackets 138 are inserted into the walls 104, as shown in FIG. 3B. The support brackets 138 are constructed of a suitable material that can withstand high temperatures without significant structural degradation or reaction with the atmosphere. In one embodiment, the support brackets 138 are constructed from molybdenum. In another embodiment, the support brackets are constructed of graphite that has been converted to SiC.

Each of the support brackets 138 comprises a web 144 and a pin 140 extending therefrom. The pin 140 fits into a corresponding hole in a horizontal portion (e.g., the top) of the wall 104. The support bracket 138 is generally U-shaped, with two walls 142 forming a C-channel extending upward from the web 144 of the bracket. The distance between the walls 142 is substantially equal to the thickness of the vertical plates 118 of the lid 112. The vertical plates 118 of the lid 112 then fit between the two walls 142 and rest upon the web 144 of the support bracket 138. Where the vertical plates 118 mate to the two walls 142, an alignment plus gap-setting recess (i.e., a bridle joint arrangement) may be cut into the vertical plates 118 (not shown). This permits the height D of the first gap 116 to be reduced, while still maintaining the same thickness of the web 144 of the support bracket 138. The depth of the recess can be adjusted in order to manipulate the height of the first gap 116. Other means of affecting the first gap 116 could also be used. For example, the first gap 116 may be created by a pin that inserts into the wall 104 and the vertical lid plate 118 with a spacing washer of desired height D of the first gap 116 machined onto or placed over the pin. Another example is to cut the first gap 116 from the bottom edges of the lid plates 118 and include tabs (not shown) that set the first gap 116.

The first gap 116 and second gap 117 permit egress or exhaust of the inert gas flow from the enclosed area 130. The total surface area of the first gap 116 is substantially equal to the cross-sectional surface area of the inlet tube 114 in order to provide for a uniform flow and pressure throughout the enclosed area 130.

The general path of the flow of inert gas within the enclosed area 130 is depicted in FIG. 2. The inert gas flows along a generally labyrinth-like path. The arrows indicating the flow path 122 are for illustrative purposes only, and the actual flow path of the inert gas can vary substantially based on any number of factors. Generally, inert gas is introduced through the inlet tube 114 to the enclosed area 130 defined by the horizontal plate 120 and vertical plates 118 of the lid 112, the walls 104, the crucible 102 and the top surface of the melt 111. The inert gas flows through the enclosed area 130 before exiting through the gaps 116, 117.

The inert gas flow path as it exits the enclosed area 130 is labyrinth-like to minimize the backflow of contaminants towards the surface of the melt 111. As more clearly shown in FIGS. 3A and 3B, the inert gas travels along a nonlinear route or path through the second gap 117 and then the first gap 116. This nonlinear route has at least a first segment and a second segment corresponding to a path traveled through the first gap 116 and second gap 117, respectively. Each of the first segment and the second segment have both a lateral and a longitudinal component. The nonlinear route ensures that once the inert gas enters second gap 117 that the contaminants contained therein are unable to reverse course and contact the surface of the melt 111. The nonlinear inert gas flow path thus ensures that contaminants entrained in the inert gas flow are unable to backflow or otherwise flow backwards and contact or contaminate the surface of the melt 111.

In some embodiments, the inert gas flow is able to more effectively shield the melt 111 from contamination because the area surrounding the surface of the melt 111 (i.e., the enclosed area 130) is enclosed with no or substantially no leaks. Contaminants that are present in the vicinity of the surface of the melt 111 are thus purged out of the enclosed area 130 by the inert gas flow.

FIG. 4 depicts a cross-section along the line 4-4 of FIG. 3B. FIG. 3A depicts a cross-section similar to that of FIG. 3B, however the support bracket 138 is not depicted, and the first gap 116 is more clearly shown.

Figure 5A:
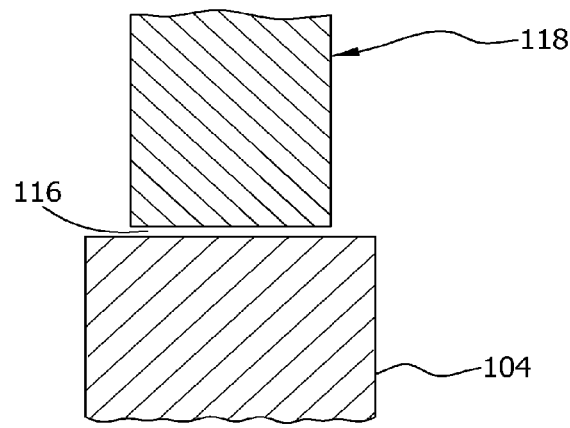
FIG. 5A is a cross-section of a portion of the lid positioned above the crucible support.
Figure 5B:
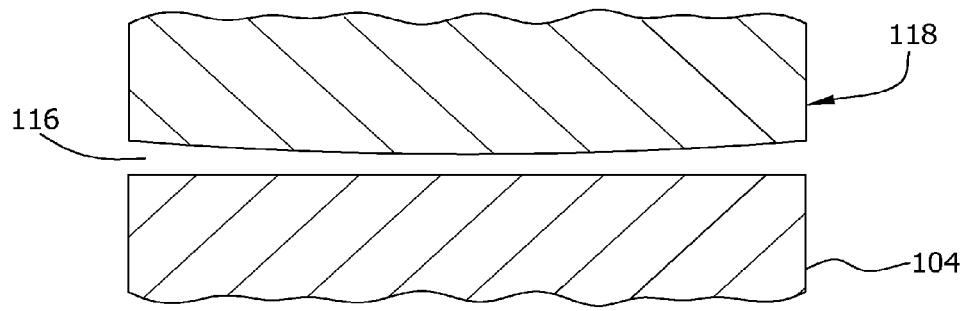
FIG. 5B is a side view of the lid positioned above the crucible support.
Figure 8:
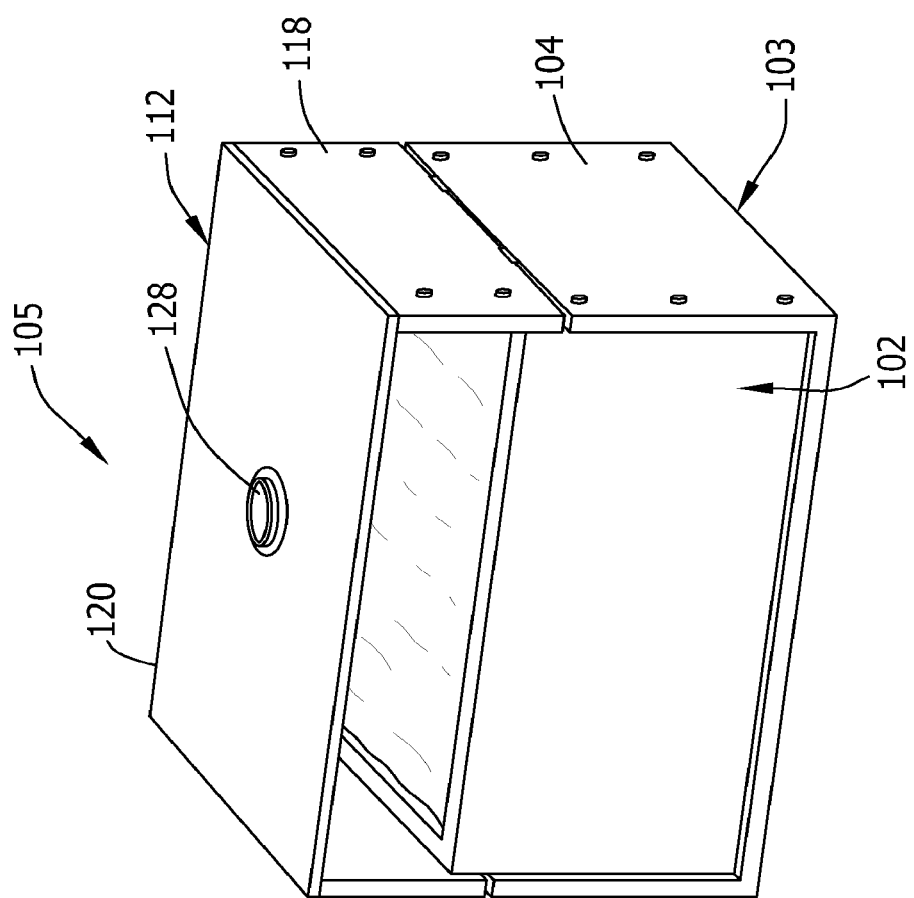
FIG. 8 is a schematic perspective view of an assembled crucible support and lid with one of the walls and a portion of the lid removed.

While FIGS. 3A and 3B depict a first gap 116 with a uniform height, other embodiments may have a non-uniform gap height as illustrated in FIGS. 5B and 8. A uniform flow across the melt 111 surface aids in providing a uniform contaminant reduction profile. However, since crucible 102 of this embodiment is substantially rectangular, e.g. square, in cross-section, achieving a uniform inert gas flow is difficult as the distance from the inlet tube 114 to the periphery of the lid 112 and corresponding first gap 116 is non-uniform. By altering the gap height along the periphery of the lid 112, the flow (e.g., the flow velocity and pressure field) of the inert gas can be manipulated. A non-uniform flow is particularly evident in the corners of the crucible 102 when the first gap 116 is of a uniform height along the periphery of the lid 112.

For instance, the height of the first gap 116 can be increased at the corners of the lid 112 to increase inert gas flow to the corners thereof. In some embodiments, the height may be increased symmetrically while in other embodiments it may be increased asymmetrically. Increasing the height of the first gap 116 can be achieved by increasing the height of the wall 104 or by decreasing the depth of the recess cut into the vertical plates 118 of the lid 112, or any combination of the two. To change the gap height asymmetrically as shown in FIGS. 5B and 8, the vertical plate 118 of the lid 112 or the top elevation of the wall 104 may have a nonuniform height profile, e.g., the height of the bottom of the vertical plate 118 may increase or the height of the wall 104 may decrease toward the corner. In this embodiment, an asymmetric gap size can be designed to provide a more uniform radial gas flow velocity through the first gap 116 and a more uniform pressure in the enclosed area 130 above the silicon melt 111. In such an embodiment, designed variations in the first gap 116 are minimized because the gap affects the gas flow and the effectiveness of removal of the gaseous carbon compounds.

FIG. 8 depicts an assembled lid and crucible support 103, with the crucible 102 inside. Note that one of the crucible walls 104, one of the lid vertical plates 118, and the inlet tube 114, are omitted from FIG. 8 for clarity.

In alternative embodiments such as those illustrated in FIG. 12, a gap (i.e., the first gap 116) between the vertical plates 118 and the walls 104 is not present. Furthermore, vertical plates 118 are not used in this embodiment. The walls 104 instead extend upward to the horizontal plate 120 of the lid 112. A plurality of vent holes 131 are thus provided in the walls 104 for the inert gas to exit therethrough. In other embodiments that include vertical plates 118 as shown in the embodiments of FIGS. 1-5, the vent holes 131 are positioned in the vertical plates and/or the walls 104. In the embodiment of FIG. 12, the vent holes 131 are sized and positioned in the walls 104 to achieve a uniform flow of inert gas above the melt 111. The vent holes 131 may be substantially circular or ovate in cross-section in some embodiments. Further, vent holes 131 in the vertical plates 118 or wall 104 may be used in conjunction with the first gap 116 between the vertical plates 118 and the wall 104.

In one embodiment, the crucible assembly or inner assembly 105 has substantially no leaks other than vents or gaps purposefully formed therein. Likewise, the furnace 100 may have no or substantially no leaks therein.

The crucible, the inlets and other related components are not expected to contribute significant amounts of carbon to the melt. Graphite components, however, may embrittle and can be fractured by the surface chemical conversion to SiC due to high temperature reaction with SiO or splattered liquid silicon. Since fractured graphite surfaces can release carbon particles into the melt, thereby increasing carbon levels, these components may be coated to prevent contributing carbon.

Figure 6:
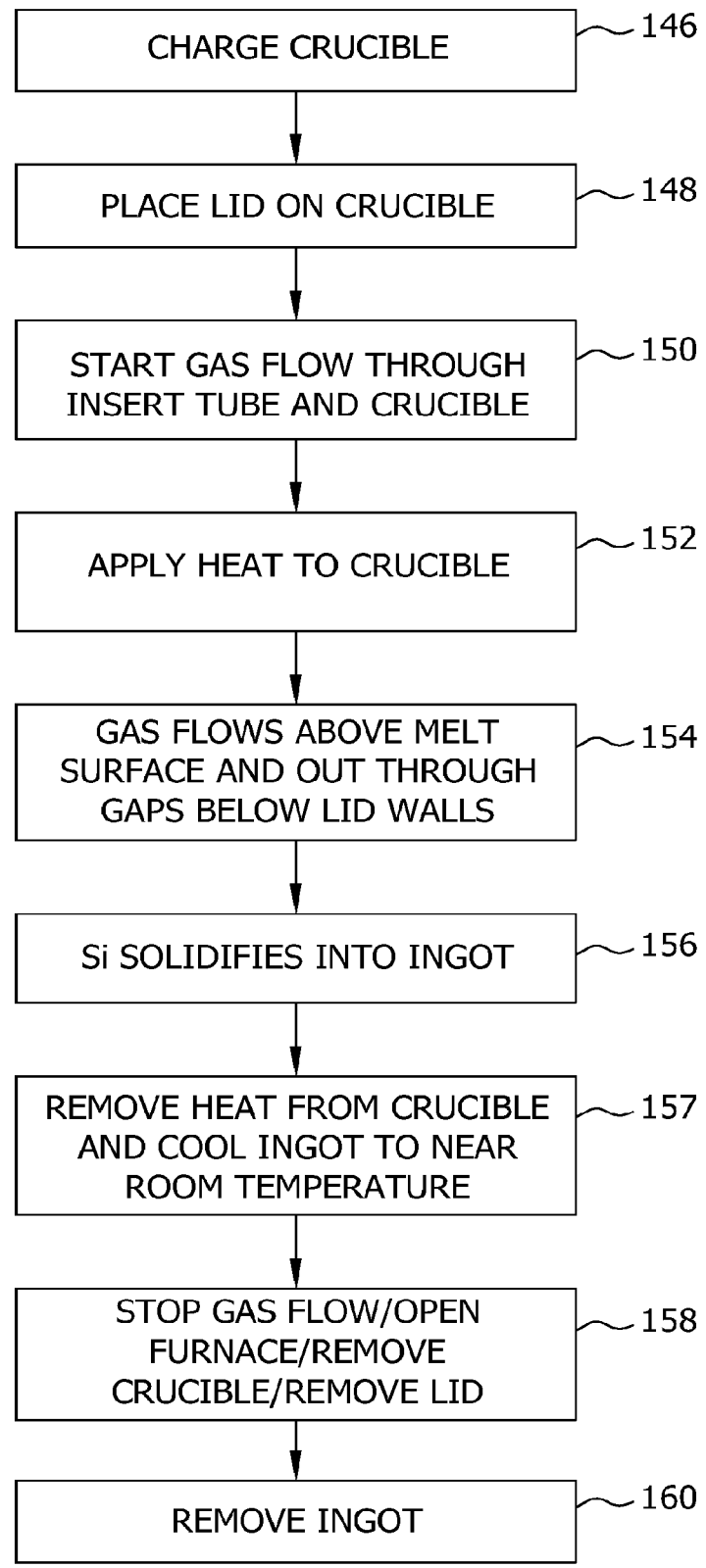
FIG. 6 is a flow diagram depicting a method of providing an inert gas flow of a melt surface in accordance with an embodiment.

FIG. 6 is a flow diagram illustrating a method of introducing and controlling an inert gas flow over a melt surface. The method begins at step 146 with placement of solid silicon into the crucible. The silicon may be in the form of solid chunks, recycled material, granular polysilicon, or powder, or any combination thereof. Dopant may also be added to the silicon or feedstock. The silicon should be of low carbon content if a low carbon result is desired, as virtually no carbon evaporates from the liquid melt surface.

Figure 11:
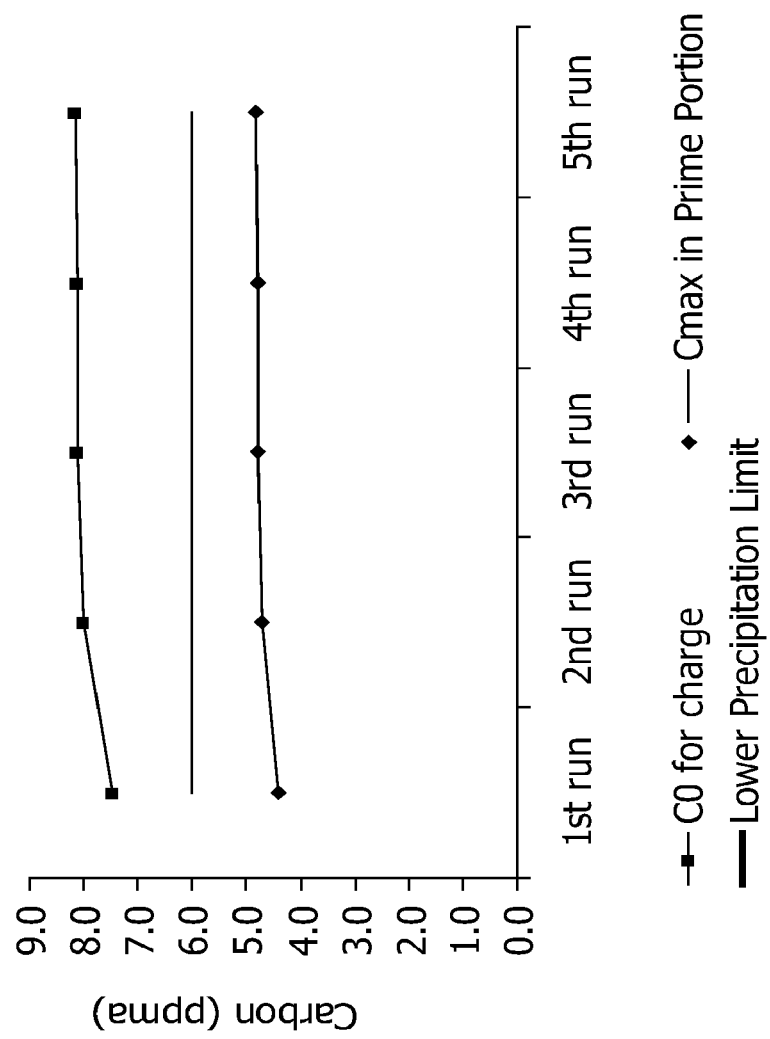
FIG. 11 is a graph showing maximum carbon concentration in a prime ingot portion for a given charge condition.

For the purpose of solar cell fabrication, low carbon may be defined as below the precipitation limit for the usable portion of the ingot. At 90% solidified, the carbon should be less than 6-8 ppma in the solid, or 75-100 ppma in solution at. Due to segregation, this carbon level will assure no carbon precipitation at all times during the solidification of the prime portion of the ingot. As shown in FIG. 11, this has been achieved in testing using virgin feedstock of carbon concentration <1.0 ppma. This level is also low enough not to enrich the recycle stream with carbon at normal recycle rates of, for example, 30%, where conventional top scrap protocol is followed (top 3-4% of ingot is not recycled).

In step 148 the lid is then placed atop the crucible assembly or support. The lid rests upon the support brackets positioned in the top of the crucible support walls and thereby is positioned over the crucible to form an enclosure having a labyrinth gap between the lid and the crucible and crucible support.

In step 150 inert gas is introduced to the area enclosed by the lid, melt surface, crucible, and crucible support walls. The gas flow in this embodiment is sufficiently pure at a sufficiently high rate to maintain low carbon levels. The inert gas may be introduced substantially simultaneously or slightly before the application of heat in step 152, according to some embodiments. The inert gas is introduced through the inlet tube in the lid. The inert gas serves at least two functions. First, it serves as a barrier between the melt surface and any contaminants present outside the crucible or the crucible assembly. These contaminants are often carbon monoxide gas generated from the release of carbon from the crucible support walls as they are heated or react with the crucible under elevated temperature. The inert gas flow also blocks other gas phase contaminants, such as iron, at elevated temperature. Note that the lid also serves to block other gas phase contaminants Heat is then applied to the crucible to melt its contents in step 152. The heat is supplied by one or more heaters positioned around the periphery of the crucible. Also, oxygen may be removed following closure (e.g., oxygen is pumped out and argon is back-filled).

In step 154, this gas flows into the vicinity of the melt surface and up between the gap between the walls 104 and the lid 112. By directing inert gas down from the inlet tube and towards the melt surface and out through the gap between the vertical plates of the lid and the crucible support wall, the flow of carbon monoxide gas and other contaminants to the melt surface can be effectively reduced. The inert gas flows through the enclosed area before exiting through the gap between the walls and the vertical plates below the top edge of the crucible to form a flow labyrinth to minimize the back-flow of contaminants By enclosing the area surrounding the melt surface, the inert gas flow is able to effectively shield the melt surface from contamination. In addition, contaminants that are present in the vicinity of the melt surface (the contaminants may be generated within the enclosed area) are purged out of the enclosed area by the inert gas flow.

Figure 7:
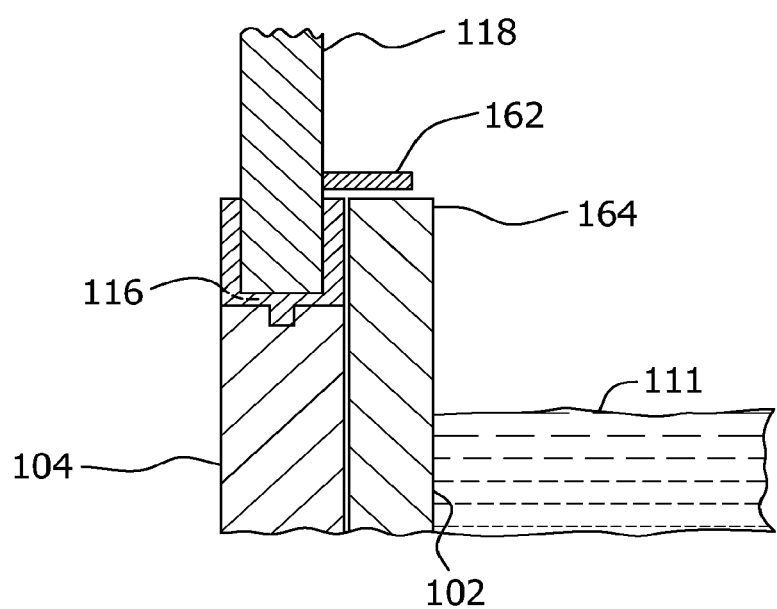
FIG. 7 is a cross-section of a lip formed in the lid in accordance with another embodiment.

As shown in the embodiment of FIG. 7, a lip 162 is formed in the interior surface of the vertical plate 118 of the lid 112. This lip 162 serves to further inhibit the back-flow of carbon monoxide or other contaminants from the furnace volume surrounding the crucible assembly or from the reaction between the crucible and the crucible support to the melt 111. The lip further serves to protect the gaps 116, 117 from silicon particulates or splash from the meltdown either of which could inhibit subsequent disassembly or could result in damage to the parts. The lip 162 extends outwardly from the interior surface of the vertical plate 118 and is positioned just above a terminal end 164 of the crucible 102. The gap between the terminal end 164 of the crucible 102 and the lip 162 is comparable to the gap 116 between vertical plate 118 and wall 104. The lip 162 extends along at least a part of the length of the vertical plates 118 in a longitudinal direction and out over the terminal end 164 of the wall of the crucible 102 in the horizontal direction. The inert gas must then flow in between the lip 162 and the terminal end 164 of the wall of the crucible 102 before flowing out through the first gap 116 between the vertical plate 118 and the wall 104. This provides an extended labyrinth or tortuous path that provides an improved barrier to the back diffusion of carbonaceous compounds.

Returning now to FIG. 6, secondly, the inert gas flow purges contaminants from the melt surface. In the event that contaminants, e.g., carbon monoxide and other carbon compounds including carbon, are present in the vicinity of the melt surface, the inert gas flow serves to purge them from the melt surface. The contaminants are effectively transported by the flow of inert gas from the melt surface and out through the gap between the vertical plates of the lid and the crucible support walls.

In one example, about 6.6 liters/hour of carbon monoxide is generated in the furnace. The inert gas is introduced at a nominal rate of 50 SLPM or a scaled (operating conditions) rate of about 472 liters/minute at silicon melting temperature (1400 degrees C.) and a pressure of 600 mBar. Assuming that no other sources of carbon monoxide are present, then the gaseous carbonaceous concentration by volume in the gap is at about 0.023%. In another embodiment, the furnace results in less than 0.03% gaseous carbonaceous compounds by volume, and in another embodiment less than 0.5% or in still another embodiment less than 5%.

After the gas exits from the enclosed area through the gaps, it may be collected and recycled for later reuse. Alternatively, the gas may be disposed of by safe venting back into the environment.

Figure 9:
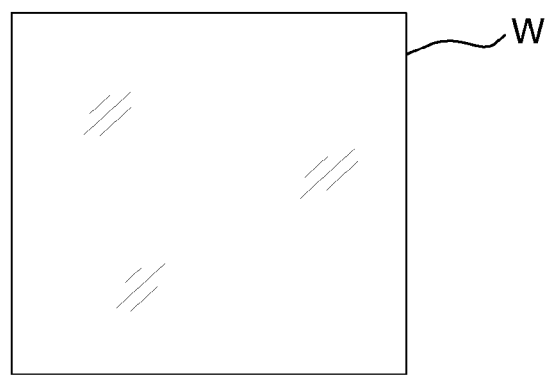
FIG. 9 is a top plan view of a silicon wafer.

Once the silicon has melted, the process of solidifying can begin (step 156). As described above, in directional solidification furnaces, the ingot first solidifies in a lower area, and the solidification proceeds in a direction roughly normal to a solidification front. As thermal energy (or heat) is removed from the bottom of the crucible, for example by a heat exchanger described above or by other means, the melt then begins to solidify in the bottom of the crucible and the solidification proceeds in a direction towards the top of the melt surface. After the silicon has solidified into an ingot, e.g., a multi-crystalline ingot, the solidified ingot is cooled in step 157. The lid is removed in step 158 and the ingot is removed from the crucible in step 160. The ingot is then sliced into multi-crystalline wafers, such as wafer W shown in FIG. 9, as is customary in the industry.

The described embodiments provide an apparatus and method to direct a flow of inert gas above a melt surface to reduce or inhibit carbon contamination in a melt or ingot.

Figure 10:
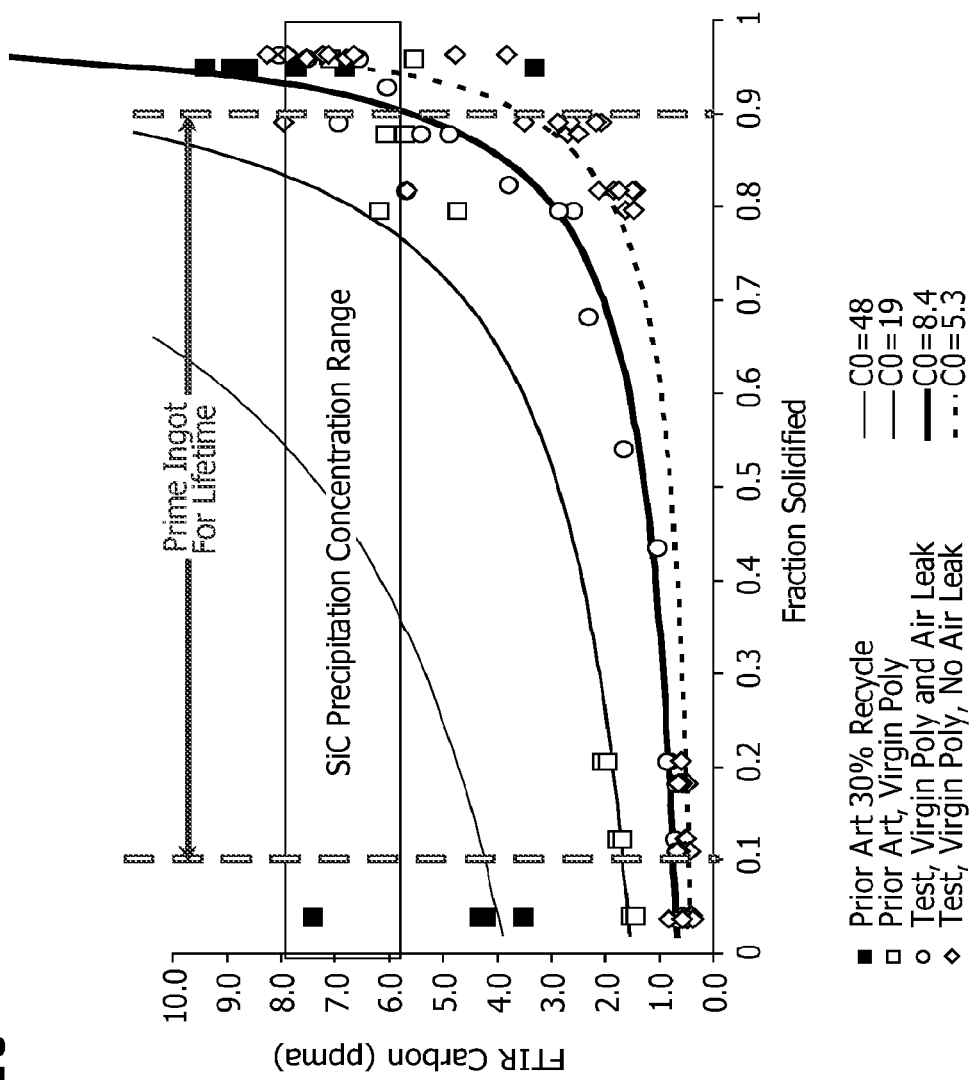
FIG. 10 is a graph showing FTIR carbon vs. the fraction solidified of various sample ingots.

As shown in FIG. 10, ingots produced by the new method and systems have substantially less carbon than those produced by prior art methods. A prior art process using 30% recycled polysilicon(poly) feedstock has an initial melt carbon concentration of 48 ppma, a relatively high carbon content which results in carbon precipitation in the ingot (the middle of the ingot) as shown. Using virgin poly of less than 1.0 ppma in the prior art process results in an initial melt concentration of 19 ppma as shown. Finally, using virgin poly and the FIGS. 1-5 embodiment without an air leak yielded the lowest carbon content. The carbon concentration measurement indicates only non-precipitated carbon in the silicon. Thus, the FTIR carbon measurement remains near the precipitation limit once precipitation begins.

The wafer or wafers produced by this process will have lower carbon than prior art wafers, as illustrated in FIGS. 10 and 11. The wafers are therefore less likely to have SiC precipitates incorporated which can cause electrical shunts in products produced therefrom, such as solar cells. Even using a typical recycle rate of, for example, 32%, the maximum predicted prime ingot carbon level will not exceed the precipitation level of 6.0 ppma, as predicted by the segregation model plotted in FIG. 11.

While the invention has been described in terms of various specific embodiments, it will be recognized that the invention can be practiced with modification within the spirit and scope of the claims.

When introducing elements of the present invention or the embodiment(s) thereof, the articles "a", "an", "the" and "said" are intended to mean that there are one or more of the elements. The terms "comprising", "including" and "having"

are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A method of manufacturing a multi-crystalline ingot comprising:
   placing solid polysilicon into a crucible;
   positioning a lid over the crucible to form an enclosure having a plurality of gaps adjacent the lid and the crucible, the plurality of gaps including a first gap oriented substantially horizontally and a second gap oriented substantially vertically and connected to the first gap, the first and second gaps forming a non-linear flow path and the only exit from the crucible;
   applying heat to melt the polysilicon;
   introducing inert gas to the enclosure such that the gas purges contaminants from the enclosure and exits the enclosure along the non-linear flow path and only through the gaps; and
   solidifying the molten polysilicon to form the ingot.

2. The method of claim 1 wherein the inert gas is introduced through an inlet tube in the lid.

3. The method of claim 2 further comprising purging oxygen from the enclosure prior to introducing inert gas.

4. The method of claim 3 further comprising collecting gas as the gas exits the enclosure.

5. The method of claim 4 further comprising recycling the collected gas.

6. The method of claim 2 wherein solidifying the polysilicon includes removing thermal energy from the crucible.

7. The method of claim 2 further comprising slicing the ingot into wafers.

8. The method of claim 1 wherein the gaps are asymmetric.

9. A method of manufacturing a multi-crystalline ingot comprising:
   placing solid polysilicon into a crucible;
   placing a lid over the crucible to form an enclosure having labyrinth gaps disposed outside the crucible, beneath a top of the crucible, and between walls of the crucible and plates of the lid;
   applying heat to melt the polysilicon;
   introducing inert gas to the enclosure such that the gas purges contaminants from the enclosure and exits the enclosure only through the gaps outside of the crucible and between the walls of the crucible and the plates of the lid; and
   solidifying the molten polysilicon to form the ingot.

10. The method of claim 9 wherein the inert gas is introduced through an inlet tube in the lid.

11. The method of claim 10 further comprising purging oxygen from the enclosure prior to introducing inert gas.

12. The method of claim 11 further comprising collecting gas as the gas exits the enclosure.

13. The method of claim 12 further comprising recycling the collected gas.

14. The method of claim 9 wherein solidifying the polysilicon includes removing thermal energy from the crucible.

15. The method of claim 9 further comprising slicing the ingot into wafers.

16. The method of claim 9 wherein the gaps are asymmetric to provide a more uniform radial gas flow velocity and a more uniform pressure.

17. The method of claim 1 further comprising positioning brackets between the lid and the crucible, wherein placing the lid over the crucible includes placing the lid over the crucible such that the lid is supported by the brackets.

18. The method of claim 9 further comprising positioning brackets between the lid and the crucible, wherein positioning the lid over the crucible includes positioning lid over the crucible such that the lid is supported by the brackets.

* * * * *